United States Patent
Yee et al.

(10) Patent No.: US 8,501,540 B2
(45) Date of Patent: Aug. 6, 2013

(54) METHOD FOR MANUFACTURE OF INLINE INTEGRATED CIRCUIT SYSTEM

(75) Inventors: Jae Hak Yee, Shanghai (CN); Junwoo Myung, Ichon-si (KR); Byoung Wook Jang, Yong-in (KR); YoungChul Kim, Yongin-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/159,095

(22) Filed: Jun. 13, 2011

(65) Prior Publication Data

US 2011/0244635 A1  Oct. 6, 2011

Related U.S. Application Data

(62) Division of application No. 12/101,915, filed on Apr. 11, 2008, now Pat. No. 7,968,981.

(51) Int. Cl.
*H01L 21/00* (2006.01)
(52) U.S. Cl.
USPC ............................................ 438/111; 438/123

(58) Field of Classification Search
USPC .................................................. 438/123, 111
See application file for complete search history.

(56) References Cited

U.S. PATENT DOCUMENTS

| | | | |
|---|---|---|---|
| 5,834,339 A | 11/1998 | Distefano et al. | |
| 6,104,095 A | 8/2000 | Shin et al. | |
| 6,202,853 B1 | 3/2001 | Bianca et al. | |
| 6,611,047 B2 | 8/2003 | Hu et al. | |
| 6,939,740 B2 | 9/2005 | Yamaguchi | |
| 7,119,421 B2 | 10/2006 | Rohrmoser et al. | |
| 7,432,586 B2 | 10/2008 | Zhao et al. | |
| 7,790,500 B2 * | 9/2010 | Ramos et al. | 438/106 |
| 2002/0006718 A1 | 1/2002 | Distefano | |
| 2002/0168797 A1 | 11/2002 | DiStefano et al. | |
| 2004/0245617 A1 | 12/2004 | Damberg et al. | |
| 2007/0090495 A1 | 4/2007 | Kim et al. | |
| 2008/0230883 A1 | 9/2008 | Yee et al. | |

* cited by examiner

*Primary Examiner* — Douglas Menz
(74) *Attorney, Agent, or Firm* — Ishimaru & Associates LLP; I-Chang John Yang (57) ABSTRACT

A method for manufacture of an integrated circuit package system includes: providing a leadframe with an integrated circuit mounted thereover; encapsulating the integrated circuit with an encapsulation; mounting an etch barrier below the leadframe; and etching the leadframe.

5 Claims, 10 Drawing Sheets

METHOD FOR MANUFACTURE OF INLINE INTEGRATED CIRCUIT SYSTEM

CROSS-REFERENCE TO RELATED APPLICATION(S)

This is a divisional of U.S. patent application Ser. No. 12/101,915 filed Apr. 11, 2008 now U.S. Pat. No. 7,968,981.

The present application contains subject matter related to co-pending U.S. patent application Ser. No. 11/689,317. The related application is assigned to STATS ChipPAC Ltd.

TECHNICAL FIELD

The present invention relates generally to integrated circuits, and more particularly to a system for inline integrated circuit package systems.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes which have significant impacts on manufacturing integration, in that they must be generally small, light weight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging and materials engineering and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high speed computer devices which are projected to exceed one TeraHertz (THz) in the near future. The current technologies, materials, equipment, and structures offer challenges to the basic assembly of these new devices while still not adequately addressing cooling and reliability concerns.

The envelope of technical capability of next generation IC package assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus a need still remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method for manufacture of an integrated circuit package system including: providing a leadframe with an integrated circuit mounted thereover; encapsulating the integrated circuit with an encapsulation; mounting an etch barrier below the leadframe; and etching the leadframe.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

The term "system" as used herein refers to and is defined as the method and as the apparatus of the present invention in accordance with the context in which the term is used.

Figure 1:
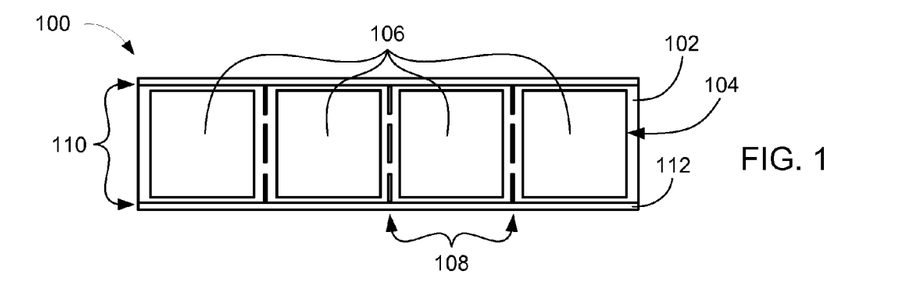
FIG. 1 is a top view of an integrated circuit package system in an in-line strip tape phase of manufacture in a first embodiment of the present invention.

Referring now to FIG. 1, therein is shown a top view of an integrated circuit package system 100 in an in-line strip tape phase of manufacture in a first embodiment of the present invention. The integrated circuit package system 100, such as a bump chip carrier or a leadframe internal stacking module, includes a leadframe 102, such as a copper leadframe.

Above the leadframe 102 is a package strip 104. The package strip 104 is comprised of individual packages 106. Between the individual packages 106 on the leadframe 102 are mold lines 108.

The mold lines 108 extend through the leadframe 102. The leadframe 102 has side rails 110 perpendicular to the mold lines 108. The side rails 110 have an etch barrier, such as a tape 112 above the side rails 110.

The tape 112 is typically a laminate material comprising an adhesive film and a tape layer. The tape 112 will shield the side rails 110, but not the mold lines 108 which will be etched away during manufacture.

It has been unexpectedly discovered that implementing the tape 112 protects the side rails 110 and subsequently reduces the risk of broken or cracked individual packages 106. The individual packages 106 have a very thin profile and the leadframe 102 contributes structural integrity to future process steps.

Figure 2:
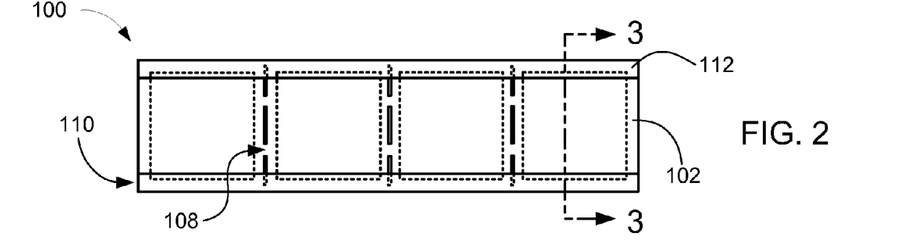
FIG. 2 is a bottom view of the integrated circuit package system of FIG. 1.

Referring now to FIG. 2, therein is shown a bottom view of the integrated circuit package system 100 of FIG. 1. The integrated circuit package system 100 is shown with the side rails 110 protected below by the tape 112. The mold lines 108 are not protected and will thus be etched away later in manufacture.

Figure 3:
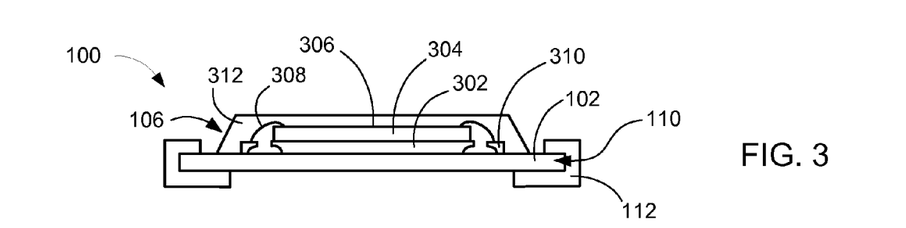
FIG. 3 is a cross sectional view of the integrated circuit package system along the line 3-3 of FIG. 2.

Referring now to FIG. 3, therein is shown a cross sectional view of the integrated circuit package system 100 along the line 3-3 of FIG. 2. The integrated circuit package system 100 is shown having a-die pad 302 and bond fingers 310 above the leadframe 102.

Above the die pad 302 is an integrated circuit 304 such as a wire-bonded die, with an active side 306. The active side 306 is connected with bond wires 308 to bond fingers 310. The side rails 110 are shown protected above and below by the tape 112.

The tape 112 may be removed from the leadframe 102 after the leadframe 102 is etched and before the individual packages 106 are tested. The individual packages 106 are shown having an encapsulation 312, such as epoxy mold compound (EMC), encapsulating the integrated circuit 304, a portion of the bond fingers 310, and the bond wires 308.

Figure 4:
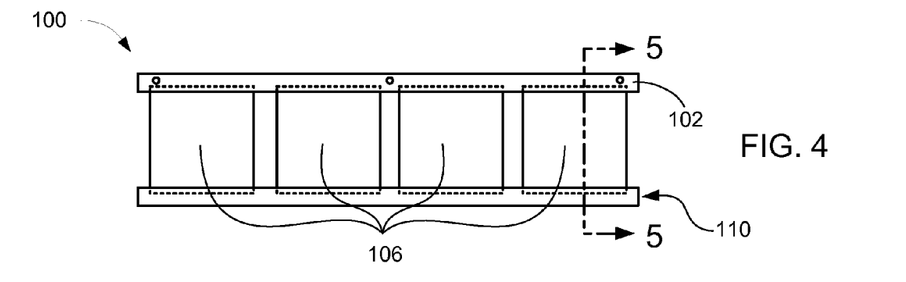
FIG. 4 is a bottom view of the integrated circuit package system of FIG. 1 in a post in-line partial etch phase of manufacture.

Referring now to FIG. 4, therein is shown a bottom view of the integrated circuit package system 100 of FIG. 1 in a post in-line partial etch phase of manufacture. The integrated circuit package system 100 is shown having the leadframe 102 largely etched away leaving only the side rails 110 of the leadframe 102. The individual packages 106 remain after the leadframe 102 is largely etched away.

Figure 5:
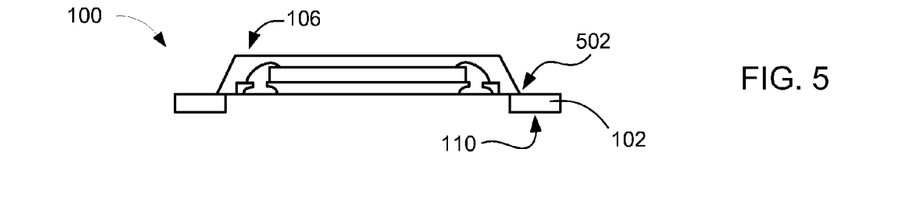
FIG. 5 is a cross sectional view of the integrated circuit package system along the line 5-5 of FIG. 4.

Referring now to FIG. 5, therein is shown a cross sectional view of the integrated circuit package system 100 along the line 5-5 of FIG. 4. The integrated circuit package system 100 is shown having the leadframe 102 largely etched away leaving the side rails 110 attached to the individual packages 106 by a small contact 502.

Figure 6:
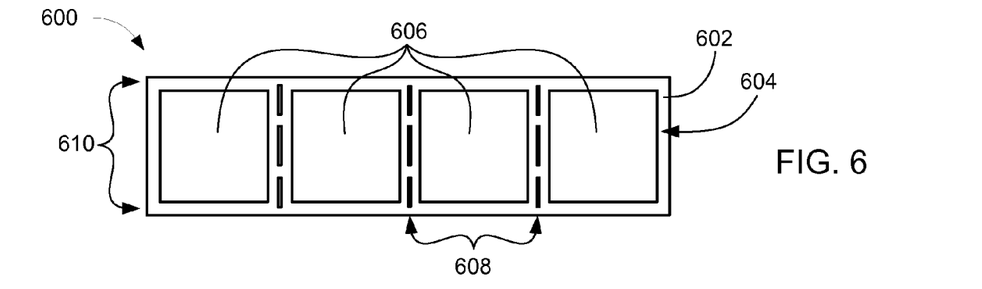
FIG. 6 is a top view of an integrated circuit package system in an in-line strip tape phase of manufacture in a second embodiment of the present invention.

Referring now to FIG. 6, therein is shown a top view of an integrated circuit package system 600 in an in-line strip tape phase of manufacture in a second embodiment of the present invention. The integrated circuit package system 600, such as a bump chip carrier or a leadframe internal stacking module, includes a leadframe 602, such as a copper leadframe.

Above the leadframe 602 is a package strip 604, such as EMC. The package strip 604 is comprised of individual packages 606. Between the individual packages 606 on the leadframe 602 are mold lines 608.

The mold lines 608 extend through the leadframe 602. The leadframe 602 has side rails 610 perpendicular to the mold lines 608.

Figure 7:
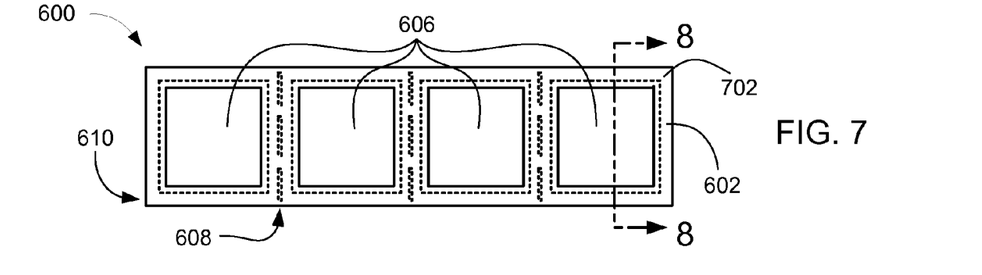
FIG. 7 is a bottom view of the integrated circuit package system of FIG. 6.

Referring now to FIG. 7, therein is shown a bottom view of the integrated circuit package system 600 of FIG. 6. The integrated circuit package system 600 is shown with the side rails 610 and the mold lines 608 protected below by an etch barrier, such as tape 702.

The tape 702 is typically a laminate material comprising an adhesive film and a tape layer. It has been unexpectedly discovered that implementing the tape 702 protects the side rails 610 and subsequently reduces the risk of broken or cracked individual packages 606. The individual packages 606 have a very thin profile and the leadframe 602 contributes structural integrity to future process steps.

Figure 8:
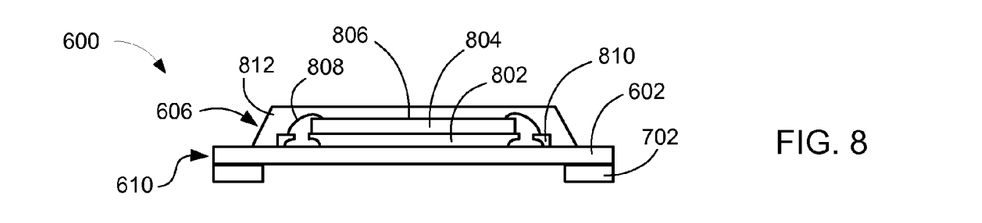
FIG. 8 is a cross sectional view of the integrated circuit package system along the line 8-8 of FIG. 7.

Referring now to FIG. 8, therein is shown a cross sectional view of the integrated circuit package system 600 along the line 8-8 of FIG. 7. The integrated circuit package system 600 is shown having a die pad 802 above the leadframe 602.

Above the die pad 802 is an integrated circuit 804 such as a wire-bonded die, with an active side 806. The active side 806 is connected with bond wires 808 to bond fingers 810. The side rails 610 are shown protected below by the tape 702.

The tape 702 may be removed from the leadframe 602 after the leadframe 602 is etched and before the individual packages 606 are tested. The individual packages 606 are shown having an encapsulation 812, such as EMC, encapsulating the integrated circuit 804 and the bond wires 808.

Figure 9:
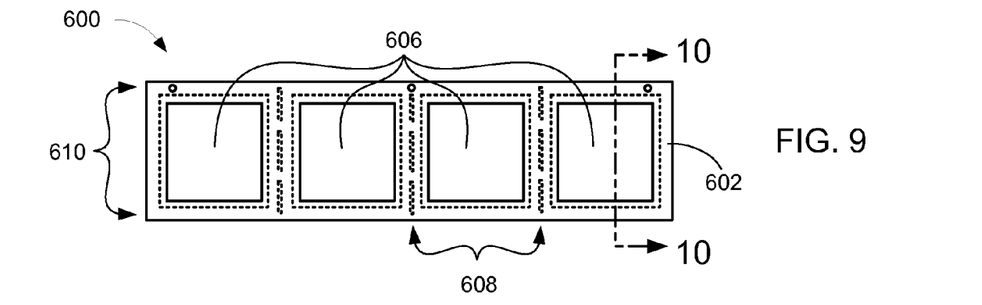
FIG. 9 is a bottom view of the integrated circuit package system of FIG. 6 in a post in-line partial etch phase of manufacture.

Referring now to FIG. 9, therein is shown a bottom view of the integrated circuit package system 600 of FIG. 6 in a post in-line partial etch phase of manufacture. The integrated circuit package system 600 is shown having the leadframe 602 largely etched away leaving only the side rails 610 and the mold lines 608 of the leadframe 602. The individual packages 606 also remain after the leadframe 602 is largely etched away.

Figure 10:
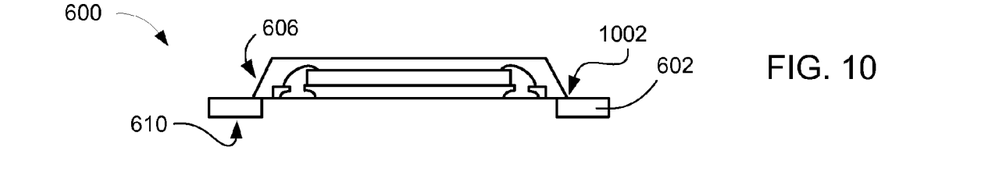
FIG. 10 is a cross sectional view of the integrated circuit package system along the line 10-10 of FIG. 9.

Referring now to FIG. 10, therein is shown a cross sectional view of the integrated circuit package system 600 along the line 10-10 of FIG. 9. The integrated circuit package system 600 is shown having the leadframe 602 largely etched away leaving the side rails 610 attached to the individual packages 606 by a small contact 1002.

Figure 11:
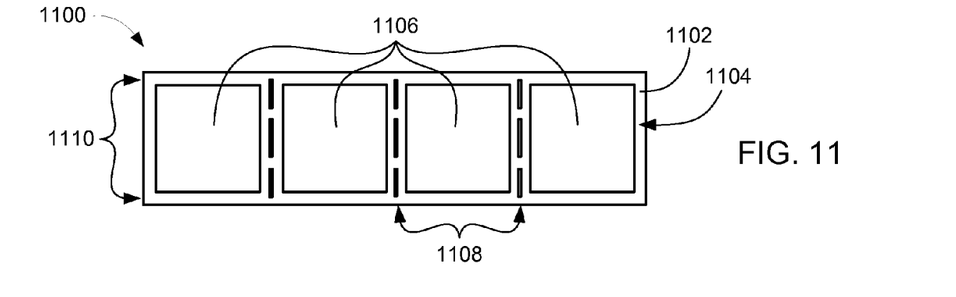
FIG. 11 is a top view of an integrated circuit package system in an in-line strip photoresist phase of manufacture in a third embodiment of the present invention.

Referring now to FIG. 11, therein is shown a top view of an integrated circuit package system 1100 in an in-line strip photoresist phase of manufacture in a third embodiment of the present invention. The integrated circuit package system 1100, such as a bump chip carrier or a leadframe internal stacking module, includes a leadframe 1102, such as a copper leadframe.

Above the leadframe 1102 is a package strip 1104, such as EMC. The package strip 1104 is comprised of individual packages 1106. Between the individual packages 1106 on the leadframe 1102 are mold lines 1108.

The mold lines 1108 extend through the leadframe 1102. The leadframe 1102 has side rails 1110 perpendicular to the mold lines 1108.

Figure 12:
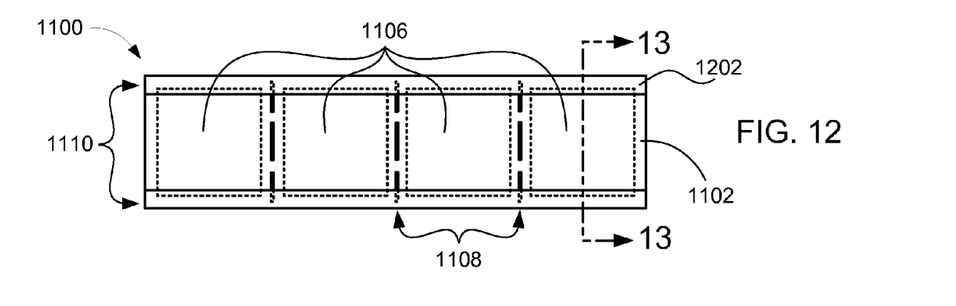
FIG. 12 is a bottom view of the integrated circuit package system of FIG. 11.

Referring now to FIG. 12, therein is shown a bottom view of the integrated circuit package system 1100 of FIG. 11. The integrated circuit package system 1100 is shown with the side rails 1110 protected below by an etch barrier, such as photoresist 1202. The mold lines 1108 are not protected and will thus be etched away later in manufacture.

It has been unexpectedly discovered that implementing the photoresist 1202 protects the side rails 1110 and subsequently reduces the risk of broken or cracked individual packages 1106. The individual packages 1106 have a very thin profile and the leadframe 1102 contributes structural integrity to future process steps.

Figure 13:
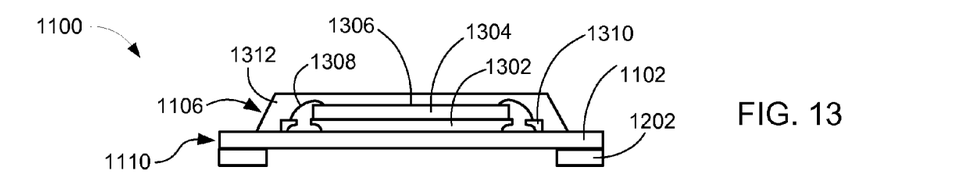
FIG. 13 is a cross sectional view of the integrated circuit package system along the line 13-13 of FIG. 12.

Referring now to FIG. 13, therein is shown a cross sectional view of the integrated circuit package system 1100 along the line 13-13 of FIG. 12. The integrated circuit package system 1100 is shown having a die pad 1302 above the leadframe 1102.

Above the die pad 1302 is an integrated circuit 1304 such as a wire-bonded die, with an active side 1306. The active side

1306 is connected with bond wires 1308 to bond fingers 1310. The side rails 1110 are shown protected below by the photoresist 1202.

The photoresist 1202 may be stripped from the leadframe 1102 after the leadframe 1102 is etched and before the individual packages 1106 are tested. The individual packages 1106 are shown having an encapsulation 1312, such as EMC, encapsulating the integrated circuit 1304 and the bond wires 1308.

Figure 14:
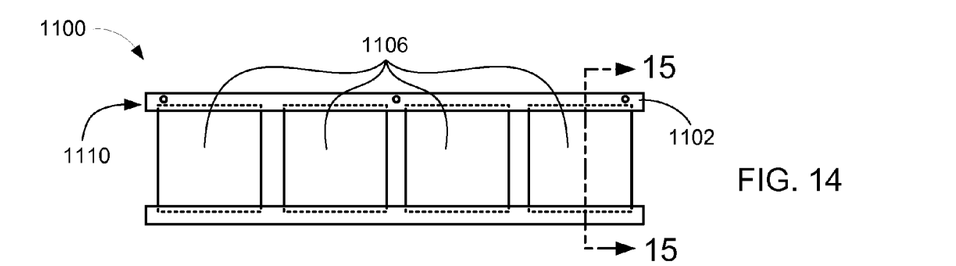
FIG. 14 is a bottom view of the integrated circuit package system of FIG. 11 in a post in-line partial etch phase of manufacture.

Referring now to FIG. 14, therein is shown a bottom view of the integrated circuit package system 1100 of FIG. 11 in a post in-line partial etch phase of manufacture. The integrated circuit package system 1100 is shown having the leadframe 1102 largely etched away leaving only the side rails 1110 of the leadframe 1102. The individual packages 1106 remain after the leadframe 1102 is largely etched away.

Figure 15:
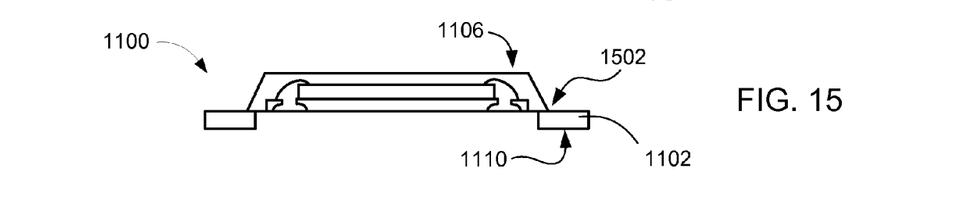
FIG. 15 is a cross sectional view of the integrated circuit package system along the line 15-15 of FIG. 14.

Referring now to FIG. 15, therein is shown a cross sectional view of the integrated circuit package system 1100 along the line 15-15 of FIG. 14. The integrated circuit package system 1100 is shown having the leadframe 1102 largely etched away leaving the side rails 1110 attached to the individual packages 1106 by a small contact 1502.

Figure 16:
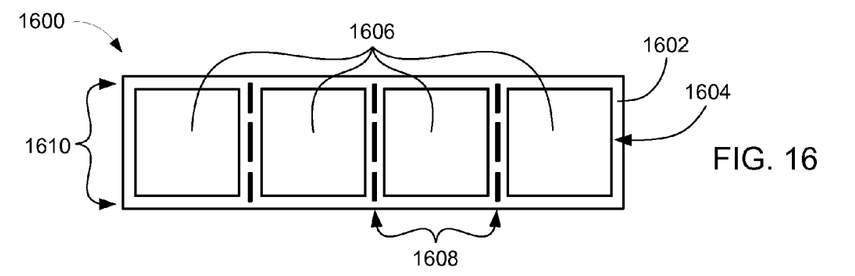
FIG. 16 is a top view of an integrated circuit package system in an in-line strip photoresist phase of manufacture in a fourth embodiment of the present invention.

Referring now to FIG. 16, therein is shown a top view of an integrated circuit package system 1600 in an in-line strip photoresist phase of manufacture in a fourth embodiment of the present invention. The integrated circuit package system 1600, such as a bump chip carrier or a leadframe internal stacking module, includes a leadframe 1602, such as a copper leadframe.

Above the leadframe 1602 is a package strip 1604, such as EMC. The package strip 1604 is comprised of individual packages 1606. Between the individual packages 1606 on the leadframe 1602 are mold lines 1608.

The mold lines 1608 extend through the leadframe 1602. The leadframe 1602 has side rails 1610 perpendicular to the mold lines 1608.

Figure 17:
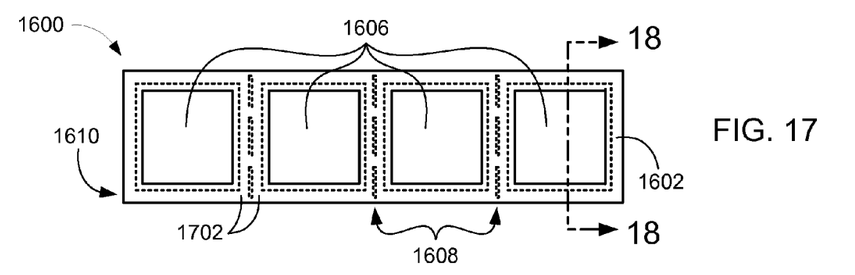
FIG. 17 is a bottom view of the integrated circuit package system of FIG. 16.

Referring now to FIG. 17, therein is shown a bottom view of the integrated circuit package system 1600 of FIG. 16. The integrated circuit package system 1600 is shown with the side rails 1610 and the mold lines 1608 protected below by an etch barrier, such as photoresist 1702.

It has been unexpectedly discovered that implementing the photoresist 1702 protects the side rails 1610 and subsequently reduces the risk of broken or cracked individual packages 1606. The individual packages 1606 have a very thin profile and the leadframe 1602 contributes structural integrity to future process steps.

Figure 18:
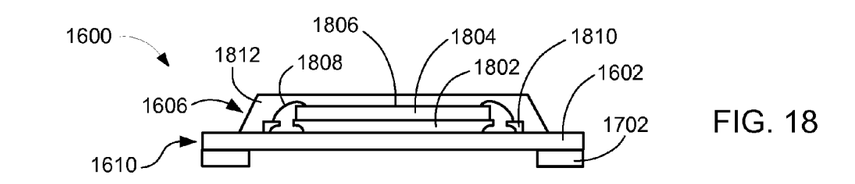
FIG. 18 is a cross sectional view of the integrated circuit package system along the line 18-18 of FIG. 17.

Referring now to FIG. 18, therein is shown a cross sectional view of the integrated circuit package system 1600 along the line 18-18 of FIG. 17. The integrated circuit package system 1600 is shown having a die pad 1802 above the leadframe 1602.

Above the die pad 1802 is an integrated circuit 1804 such as a wire-bonded die, with an active side 1806. The active side 1806 is connected with bond wires 1808 to bond fingers 1810. The side rails 1610 are shown protected below by the photoresist 1702.

The photoresist 1702 may be stripped from the leadframe 1602 after the leadframe 1602 is etched and before the individual packages 1606 are tested. The individual packages 1606 are shown having an encapsulation 1812, such as EMC, encapsulating the integrated circuit 1804 and the bond wires 1808.

Figure 19:
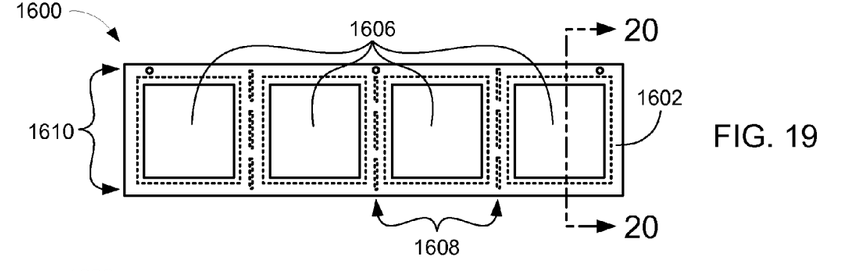
FIG. 19 is a bottom view of the integrated circuit package system of FIG. 16 in a post in-line partial etch phase of manufacture.

Referring now to FIG. 19, therein is shown a bottom view of the integrated circuit package system 1600 of FIG. 16 in a post in-line partial etch phase of manufacture. The integrated circuit package system 1600 is shown having the leadframe 1602 largely etched away leaving only the side rails 1610 and the mold lines 1608 of the leadframe 1602. The individual packages 1606 remain after the leadframe 1602 is largely etched away.

Figure 20:
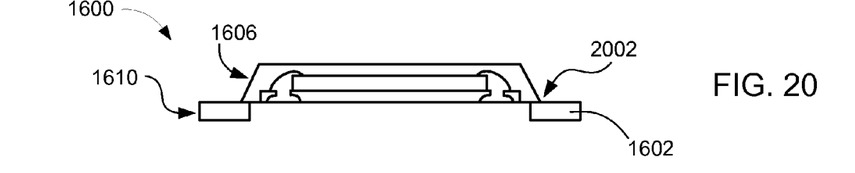
FIG. 20 is a cross sectional view of the integrated circuit package system along the line 20-20 of FIG. 19.

Referring now to FIG. 20, therein is shown a cross sectional view of the integrated circuit package system 1600 along the line 20-20 of FIG. 19. The integrated circuit package system 1600 is shown having the leadframe 1602 largely etched away leaving the side rails 1610 attached to the individual packages 1606 by a small contact 2002.

Figure 21:
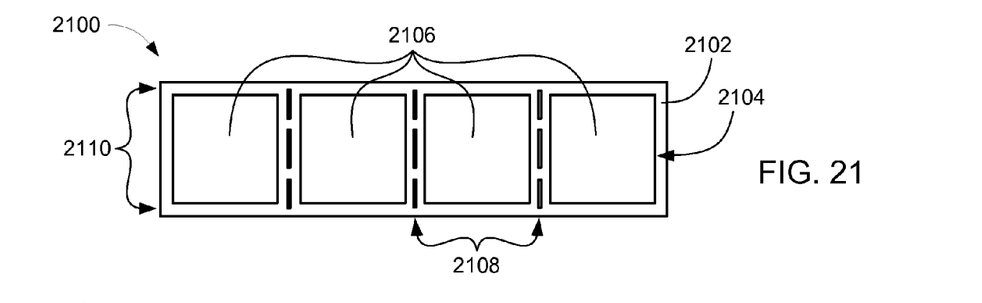
FIG. 21 is a top view of an integrated circuit package system in an in-line strip mold part phase of manufacture in a fifth embodiment of the present invention.

Referring now to FIG. 21, therein is shown a top view of an integrated circuit package system 2100 in an in-line strip mold part phase of manufacture in a fifth embodiment of the present invention. The integrated circuit package system 2100, such as a bump chip carrier or a leadframe internal stacking module, includes a leadframe 2102, such as a copper leadframe.

Above the leadframe 2102 is a package strip 2104, such as EMC. The package strip 2104 is comprised of individual packages 2106. Between the individual packages 2106 on the leadframe 2102 are mold lines 2108.

The mold lines 2108 extend through the leadframe 2102. The leadframe 2102 has side rails 2110 perpendicular to the mold lines 2108.

Figure 22:
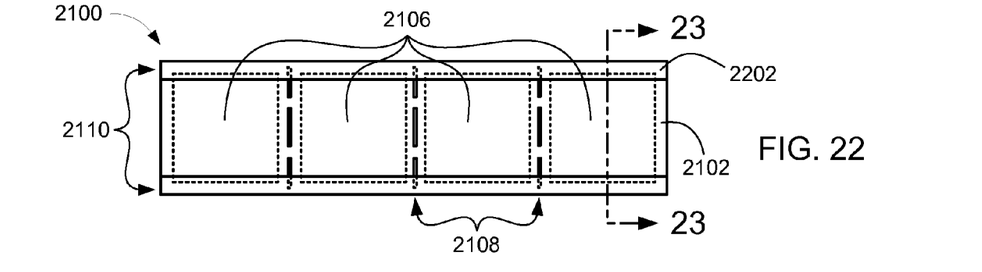
FIG. 22 is a bottom view of the integrated circuit package system of FIG. 21.

Referring now to FIG. 22, therein is shown a bottom view of the integrated circuit package system 2100 of FIG. 21. The integrated circuit package system 2100 is shown with the side rails 2110 protected below by an etch barrier, such as a mold part 2202. The mold lines 2108 are not protected and will thus be etched away later in manufacture.

It has been unexpectedly discovered that implementing the mold part 2202 protects the side rails 2110 and subsequently reduces the risk of broken or cracked individual packages 2106. The individual packages 2106 have a very thin profile and the leadframe 2102 contributes structural integrity to future process steps.

Figure 23:
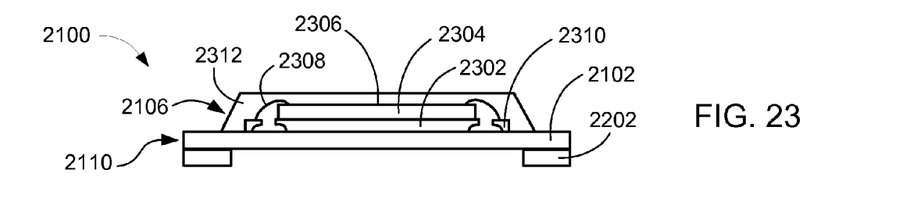
FIG. 23 is a cross sectional view of the integrated circuit package system along the line 23-23 of FIG. 22.

Referring now to FIG. 23, therein is shown a cross sectional view of the integrated circuit package system 2100 along the line 23-23 of FIG. 22. The integrated circuit package system 2100 is shown having a die pad 2302 above the leadframe 2102.

Above the die pad 2302 is an integrated circuit 2304 such as a wire-bonded die, with an active side 2306. The active side 2306 is connected with bond wires 2308 to bond fingers 2310. The side rails 2110 are shown protected below by the mold part 2202. The individual packages 2106 are shown having an encapsulation 2312, such as EMC, encapsulating the integrated circuit 2304 and the bond wires 2308.

Figure 24:
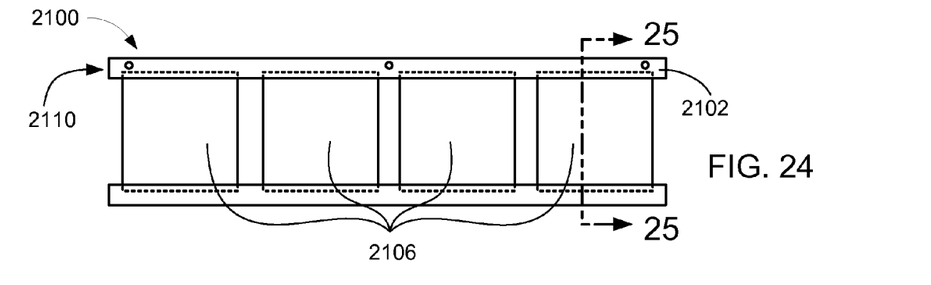
FIG. 24 is a bottom view of the integrated circuit package system of FIG. 21 in a post in-line partial etch phase of manufacture.

Referring now to FIG. 24, therein is shown a bottom view of the integrated circuit package system 2100 of FIG. 21 in a post in-line partial etch phase of manufacture. The integrated circuit package system 2100 is shown having the leadframe 2102 largely etched away leaving only the side rails 2110 of the leadframe 2102. The individual packages 2106 remain after the leadframe 2102 is largely etched away.

Figure 25:
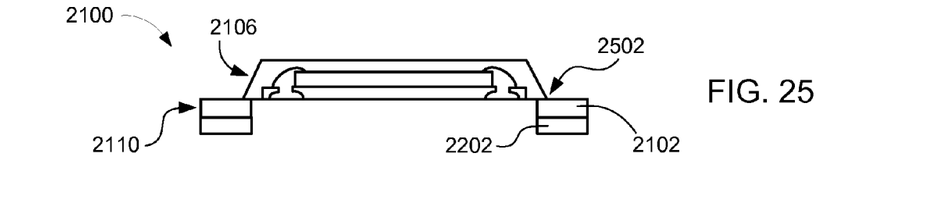
FIG. 25 is a cross sectional view of the integrated circuit package system along the line 25-25 of FIG. 24.

Referring now to FIG. 25, therein is shown a cross sectional view of the integrated circuit package system 2100 along the line 25-25 of FIG. 24. The integrated circuit package system 2100 is shown having the leadframe 2102 largely etched away leaving the side rails 2110 attached to the individual packages 2106 by a small contact 2502.

Figure 26:
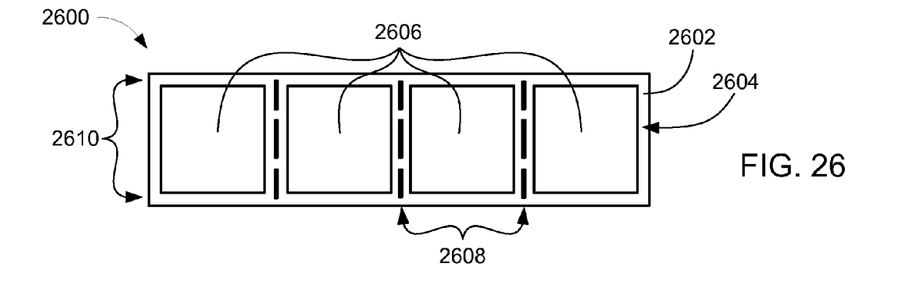
FIG. 26 is a top view of an integrated circuit package system in an in-line strip mold part phase of manufacture in a sixth embodiment of the present invention.

Referring now to FIG. 26, therein is shown a top view of an integrated circuit package system 2600 in an in-line strip mold part phase of manufacture in a sixth embodiment of the present invention. The integrated circuit package system 2600, such as a bump chip carrier or a leadframe internal stacking module, includes a leadframe 2602, such as a copper leadframe.

Above the leadframe 2602 is a package strip 2604, such as EMC. The package strip 2604 is comprised of individual packages 2606. Between the individual packages 2606 on the leadframe 2602 are mold lines 2608.

The mold lines 2608 extend through the leadframe 2602. The leadframe 2602 has side rails 2610 perpendicular to the mold lines 2608.

Figure 27:
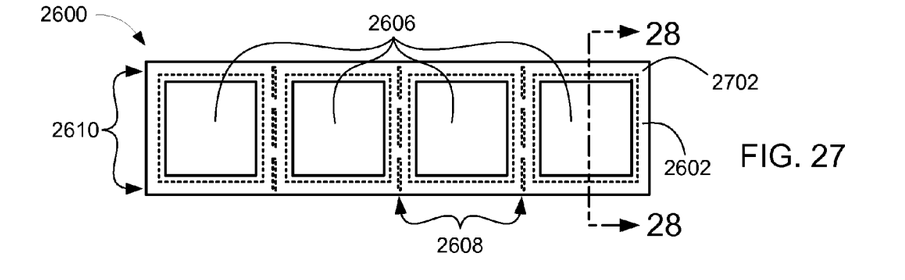
FIG. 27 is a bottom view of the integrated circuit package system of FIG. 26.

Referring now to FIG. 27, therein is shown a bottom view of the integrated circuit package system 2600 of FIG. 26. The integrated circuit package system 2600 is shown with the side rails 2610 and the mold lines 2608 protected below by an etch barrier, such a as mold part 2702.

It has been unexpectedly discovered that implementing the mold part 2702 protects the side rails 2610 and subsequently reduces the risk of broken or cracked individual packages 2606. The individual packages 2606 have a very thin profile and the leadframe 2602 contributes structural integrity to future process steps.

Figure 28:
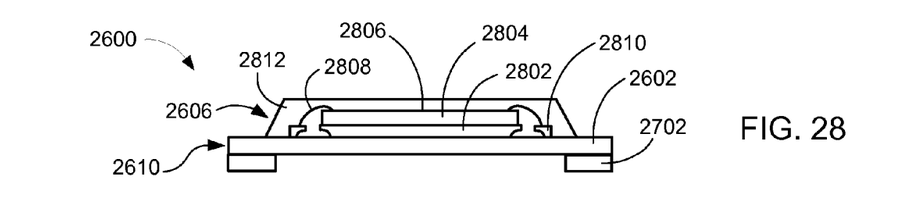
FIG. 28 is a cross sectional view of the integrated circuit package system along the line 28-28 of FIG. 27.

Referring now to FIG. 28, therein is shown a cross sectional view of the integrated circuit package system 2600 along the line 28-28 of FIG. 27. The integrated circuit package system 2600 is shown having a die pad 2802 above the leadframe 2602.

Above the die pad 2802 is an integrated circuit 2804 such as a wire-bonded die, with an active side 2806. The active side 2806 is connected with bond wires 2808 to bond fingers 2810. The side rails 2610 are shown protected below by the mold part 2702. The individual packages 2606 are shown having an encapsulation 2812, such as EMC, encapsulating the integrated circuit 2804 and the bond wires 2808.

Figure 29:
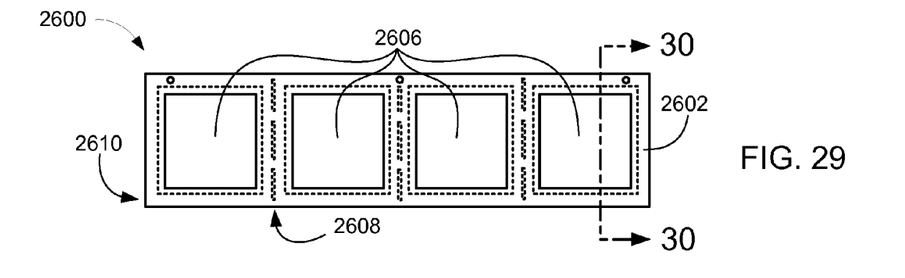
FIG. 29 is a bottom view of the integrated circuit package system of FIG. 26 in a post in-line partial etch phase of manufacture.

Referring now to FIG. 29, therein is shown a bottom view of the integrated circuit package system 2600 of FIG. 26 in a post in-line partial etch phase of manufacture. The integrated circuit package system 2600 is shown having the leadframe 2602 largely etched away leaving only the side rails 2610 and the mold lines 2608 of the leadframe 2602. The individual packages 2606 remain after the leadframe 2602 is largely etched away.

Figure 30:
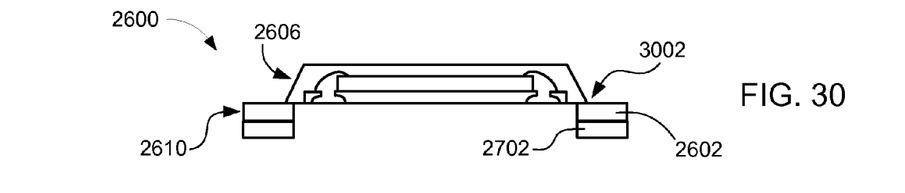
FIG. 30 is a cross sectional view of the integrated circuit package system along the line 30-30 of FIG. 29.

Referring now to FIG. 30, therein is shown a cross sectional view of the integrated circuit package system 2600 along the line 30-30 of FIG. 29. The integrated circuit package system 2600 is shown having the leadframe 2602 largely etched away leaving the side rails 2610 attached to the individual packages 2606 by a small contact 3002. The mold part 2702 is not removed after the partial etch phase of manufacture.

Figure 31:
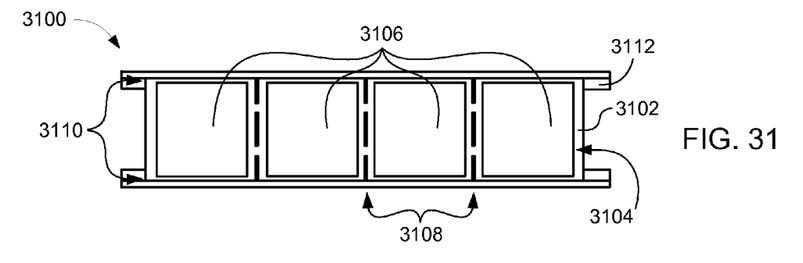
FIG. 31 is a top view of an integrated circuit package system in an in-line strip guide rail phase of manufacture in a seventh embodiment of the present invention.

Referring now to FIG. 31, therein is shown a top view of an integrated circuit package system 3100 in an in-line strip guide rail phase of manufacture in a seventh embodiment of the present invention. The integrated circuit package system 3100, such as a bump chip carrier or a leadframe internal stacking module, includes a leadframe 3102, such as a copper leadframe.

Above the leadframe 3102 is a package strip 3104, such as EMC. The package strip 3104 is comprised of individual packages 3106. Between the individual packages 3106 on the leadframe 3102 are mold lines 3108.

The mold lines 3108 extend through the leadframe 3102. The leadframe 3102 has side rails 3110 perpendicular to the mold lines 3108. The side rails 3110 have an etch barrier, such as a guide rail 3112 above the side rails 3110.

The guide rail 3112 will shield the side rails 3110, but not the mold lines 3108 which will be etched away during manufacture. The guide rails 3112 will allow movement of the leadframe 3102 while still providing an etch barrier.

It has been unexpectedly discovered that implementing the guide rail 3112 protects the side rails 3110 and subsequently reduces the risk of broken or cracked individual packages 3106. The individual packages 3106 have a very thin profile and the leadframe 3102 contributes structural integrity to future process steps.

Figure 32:
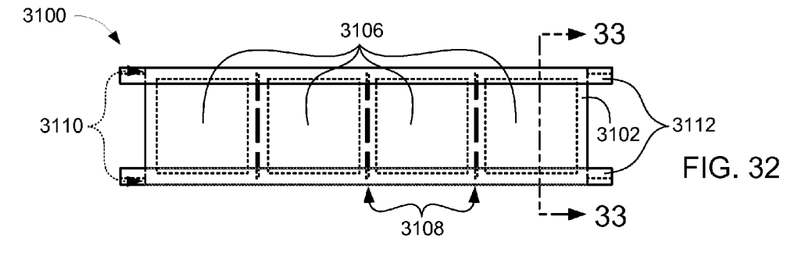
FIG. 32 is a bottom view of the integrated circuit package system of FIG. 31.

Referring now to FIG. 32, therein is shown a bottom view of the integrated circuit package system 3100 of FIG. 31. The integrated circuit package system 3100 is shown with the side rails 3110 protected below by the guide rail 3112. The mold lines 3108 are not protected and will thus be etched away later in manufacture.

Figure 33:
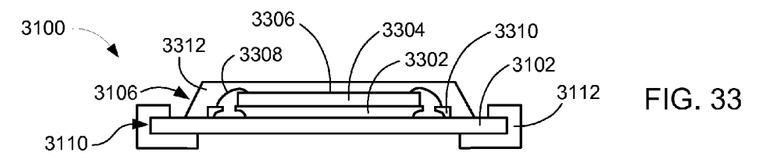
FIG. 33 is a cross sectional view of the integrated circuit package system along the line 33-33 of FIG. 32.

Referring now to FIG. 33, therein is shown a cross sectional view of the integrated circuit package system 3100 along the line 33-33 of FIG. 32. The integrated circuit package system 3100 is shown having a die pad 3302 above the leadframe 3102.

Above the die pad 3302 is an integrated circuit 3304 such as a wire-bonded die, with an active side 3306. The active side 3306 is connected with bond wires 3308 to bond fingers 3310. The side rails 3110 are shown protected above and below by the guide rail 3112.

The guide rail 3112 may be removed from the leadframe 3102 after the leadframe 3102 is etched and before the individual packages 3106 are tested. The individual packages 3106 are shown having an encapsulation 3312, such as EMC, encapsulating the integrated circuit 3304 and the bond wires 3308.

Figure 34:
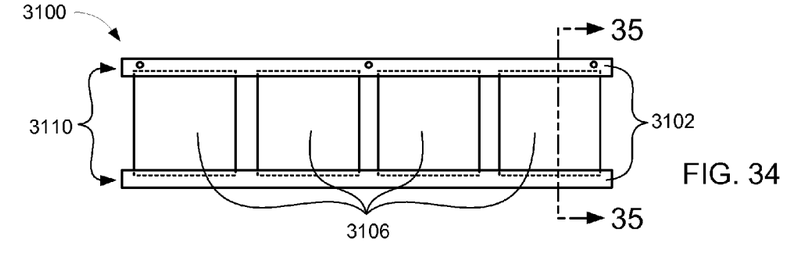
FIG. 34 is a bottom view of the integrated circuit package system of FIG. 31 in a post in-line partial etch phase of manufacture.

Referring now to FIG. 34, therein is shown a bottom view of the integrated circuit package system 3100 of FIG. 31 in a post in-line partial etch phase of manufacture. The integrated circuit package system 3100 is shown having the leadframe 3102 largely etched away leaving only the side rails 3110 of the leadframe 3102. The individual packages 3106 remain after the leadframe 3102 is largely etched away.

Figure 35:
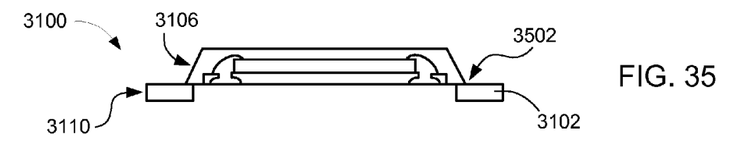
FIG. 35 is a cross sectional view of the integrated circuit package system along the line 35-35 of FIG. 34.

Referring now to FIG. 35, therein is shown a cross sectional view of the integrated circuit package system 3100 along the line 35-35 of FIG. 34. The integrated circuit package system 3100 is shown having the leadframe 3102 largely etched away leaving the side rails 3110 attached to the individual packages 3106 by a small contact 3502.

Figure 36:
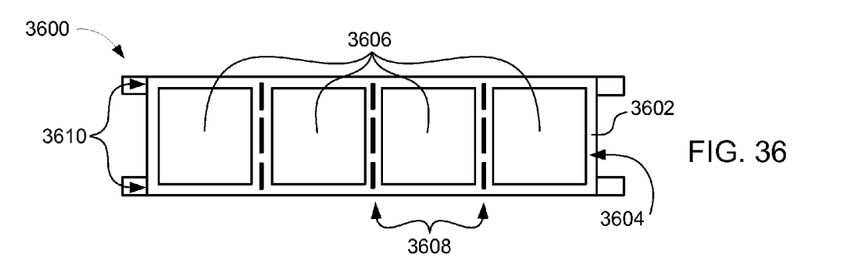
FIG. 36 is a top view of an integrated circuit package system in an in-line strip guide rail phase of manufacture in an eighth embodiment of the present invention.

Referring now to FIG. 36, therein is shown a top view of an integrated circuit package system 3600 in an in-line strip guide rail phase of manufacture in an eighth embodiment of the present invention. The integrated circuit package system 3600, such as a bump chip carrier or a leadframe internal stacking module, includes a leadframe 3602, such as a copper leadframe.

Above the leadframe 3602 is a package strip 3604, such as EMC. The package strip 3604 is comprised of individual packages 3606. Between the individual packages 3606 on the leadframe 3602 are mold lines 3608.

The mold lines 3608 extend through the leadframe 3602. The leadframe 3602 has side rails 3610 perpendicular to the mold lines 3608.

Figure 37:
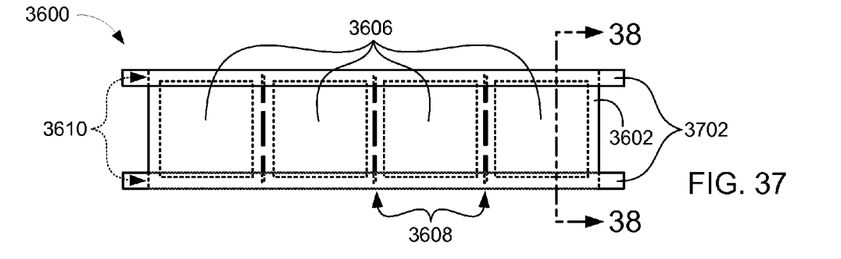
FIG. 37 is a bottom view of the integrated circuit package system of FIG. 36.

Referring now to FIG. 37, therein is shown a bottom view of the integrated circuit package system 3600 of FIG. 36. The integrated circuit package system 3600 is shown with the side rails 3610 protected below by an etch barrier, such as guide rails 3702. The mold lines 3608 are not protected and will thus be etched away later in manufacture. The guide rails 3702 will allow movement of the leadframe 3602 while still providing an etch barrier.

It has been unexpectedly discovered that implementing the guide rail 3702 protects the side rails 3610 and subsequently reduces the risk of broken or cracked individual packages 3606. The individual packages 3606 have a very thin profile and the leadframe 3602 contributes structural integrity to future process steps.

Figure 38:
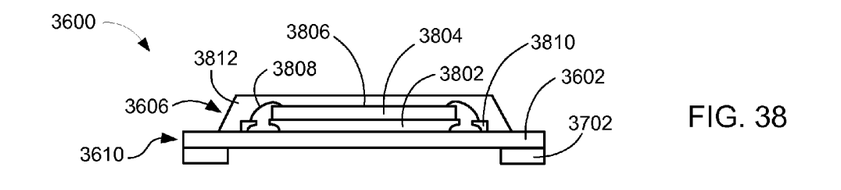
FIG. 38 is a cross sectional view of the integrated circuit package system along the line 38-38 of FIG. 37.

Referring now to FIG. 38, therein is shown a cross sectional view of the integrated circuit package system 3600 along the line 38-38 of FIG. 37. The integrated circuit package system 3600 is shown having a die pad 3802 above the leadframe 3602.

Above the die pad 3802 is an integrated circuit 3804 such as a wire-bonded die, with an active side 3806. The active side 3806 is connected with bond wires 3808 to bond fingers 3810. The side rails 3610 are shown protected below by the guide rail 3702. The individual packages 3606 are shown having an encapsulation 3812, such as EMC, encapsulating the integrated circuit 3804 and the bond wires 3808.

Figure 39:
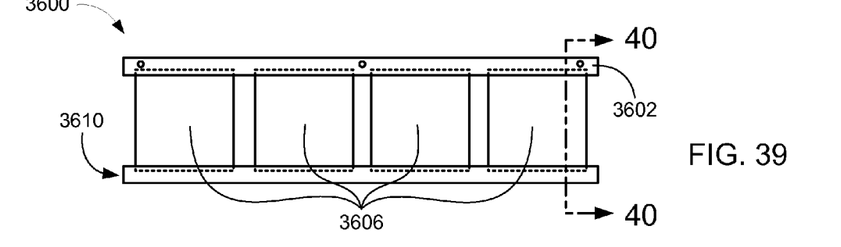
FIG. 39 is a bottom view of the integrated circuit package system of FIG. 36 in a post in-line partial etch phase of manufacture.

Referring now to FIG. 39, therein is shown a bottom view of the integrated circuit package system 3600 of FIG. 36 in a post in-line partial etch phase of manufacture. The integrated circuit package system 3600 is shown having the leadframe 3602 largely etched away leaving only the side rails 3610 of the leadframe 3602. The individual packages 3606 remain after the leadframe 3602 is largely etched away.

Figure 40:
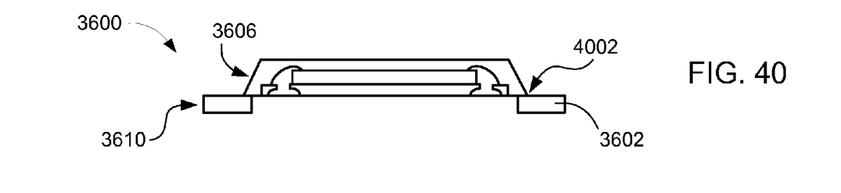
FIG. 40 is a cross sectional view of the integrated circuit package system along the line 40-40 of FIG. 39.

Referring now to FIG. 40, therein is shown a cross sectional view of the integrated circuit package system 3600 along the line 40-40 of FIG. 39. The integrated circuit package system 3600 is shown having the leadframe 3602 largely etched away leaving the side rails 3610 attached to the individual packages 3606 by a small contact 4002.

Figure 41:
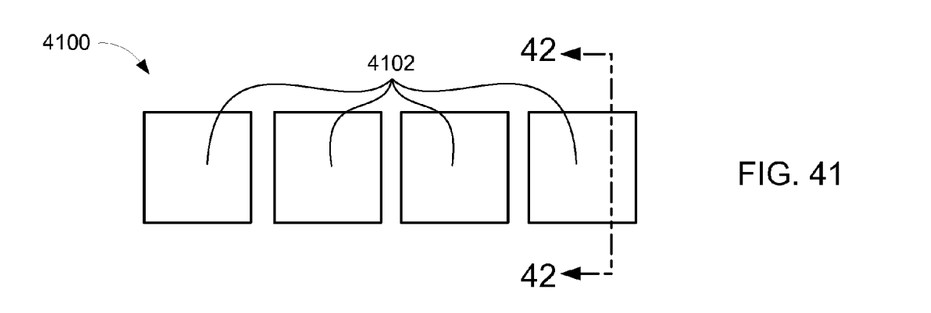
FIG. 41 is a top view of an integrated circuit package system in a pre-inline strip test phase of manufacture in an embodiment of the present invention.

Referring now to FIG. 41, therein is shown a top view of an integrated circuit package system 4100 in a pre-inline strip test phase of manufacture in an embodiment of the present invention. The integrated circuit package system 4100 is shown having individual packages 4102 such as EMC. The individual packages 4102 may be tested individually or may be tested using an inline strip test.

Figure 42:
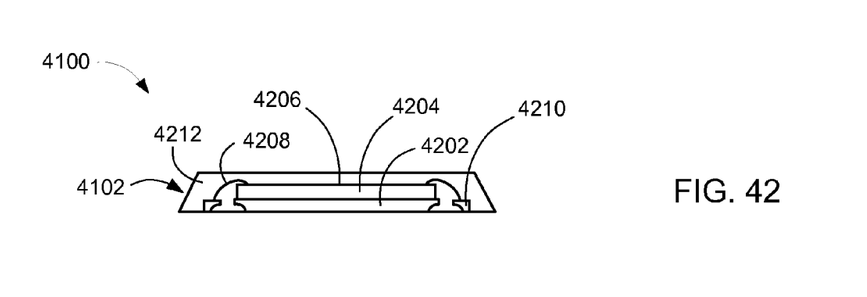
FIG. 42 is a cross sectional view of the integrated circuit package system along the line 42-42 of FIG. 41.

Referring now to FIG. 42, therein is shown a cross sectional view of the integrated circuit package system 4100 along the line 42-42 of FIG. 41. The integrated circuit package system 4100 is shown having a die pad 4202.

Above the die pad 4202 is an integrated circuit 4204 such as a wire-bonded die, with an active side 4206. The active side 4206 is connected with bond wires 4208 to bond fingers 4210. The individual packages 4102 are shown having an encapsulation 4212, such as EMC, encapsulating the integrated circuit 4204 and the bond wires 4208.

Figure 43:
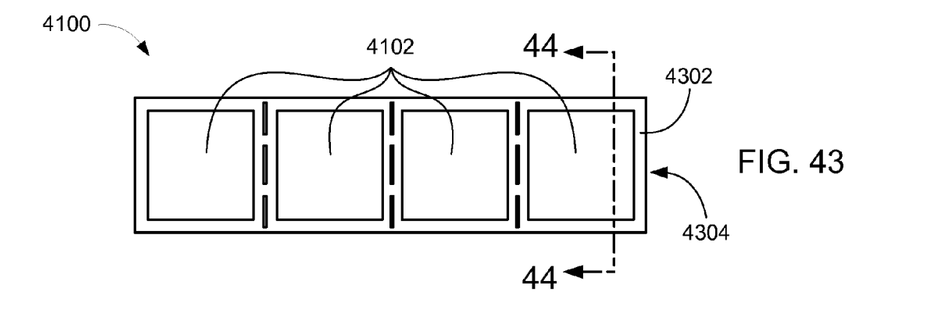
FIG. 43 is a top view of the integrated circuit package system of FIG. 41 in an inline strip test phase of manufacture.

Referring now to FIG. 43, therein is shown a top view of the integrated circuit package system 4100 of FIG. 41 in an inline strip test phase of manufacture. The integrated circuit package system 4100 is shown having a leadframe 4302.

Above the leadframe 4302 the individual packages 4102 are mounted. The individual packages 4102 are mounted above the leadframe 4302. The individual packages 4102 are grouped on the leadframe 4302 in a strip 4304.

Figure 44:
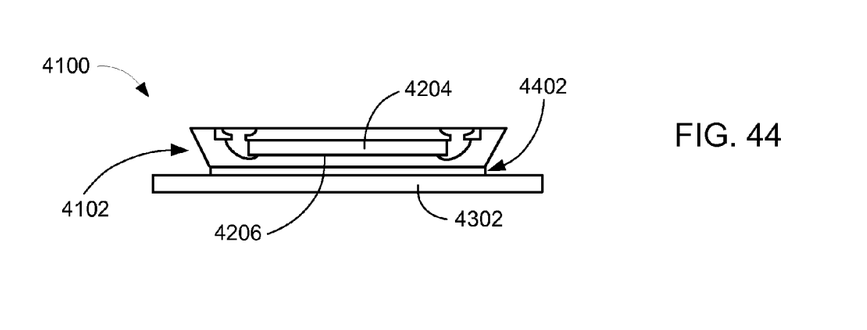
FIG. 44 is a cross sectional view of the integrated circuit package system along the line 44-44 of FIG. 43.

Referring now to FIG. 44, therein is shown a cross sectional view of the integrated circuit package system 4100 along the line 44-44 of FIG. 43. The integrated circuit package system 4100 is shown having the individual packages 4102 mounted inverted over the leadframe 4302 so that the active side 4206 is facing toward the leadframe 4302.

The individual packages 4102 are shown attached to the leadframe 4302 with sticky tape 4402. Because the individual packages 4102 are inverted it allows access to the components and allows all the individual packages 4102 to be tested together saving valuable process time.

Figure 45:
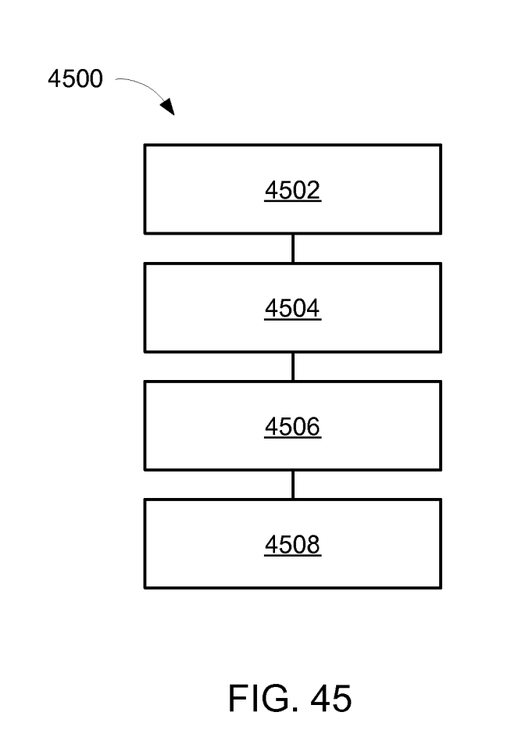
FIG. 45 is a flow chart of an integrated circuit package system for manufacture of an integrated circuit package system in an embodiment of the present invention.

Referring now to FIG. 45, therein is shown a flow chart of a system 4500 for inline integrated circuit manufacture in an embodiment of the present invention. The system 4500 includes providing a leadframe with an integrated circuit mounted thereover in a block 4502; encapsulating the integrated circuit with an encapsulation in a block 4504; mounting an etch barrier below the leadframe in a block 4506; and etching the leadframe in a block 4508.

It has been discovered that the present invention thus has numerous aspects.

A principle aspect that has been unexpectedly discovered is that the present invention reduces the risk of breaking the fragile individual packages. Another aspect is the process time is greatly reduced due to strip testing.

Yet another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacture of an integrated circuit package system comprising:
   providing an integrated circuit;
   encapsulating the integrated circuit with an encapsulation;
   providing a leadframe having a central portion and side rails,
   mounting the integrated circuit above the central portion of the leadframe;
   mounting an etch barrier below the leadframe with the etch barrier protecting the side rails; and
   etching the central portion of the leadframe leaving the side rails substantially intact.

2. The method as claimed in claim 1 wherein:
   mounting the etch barrier below the leadframe includes mounting a tape below the leadframe.

3. The method as claimed in claim 1 wherein:
   mounting the etch barrier below the leadframe includes mounting photoresist below the leadframe.

4. The method as claimed in claim 1 wherein:
   mounting the etch barrier below the leadframe includes mounting a guide rail below the leadframe.

5. The method as claimed in claim 1 wherein:
   mounting the etch barrier below the leadframe includes mounting a mold part below the leadframe.

* * * * *